United States Patent [19]
Yu et al.

[11] Patent Number: 6,027,861
[45] Date of Patent: Feb. 22, 2000

[54] VLSIC PATTERNING PROCESS

[75] Inventors: Chen-Hua Yu; Syun-Ming Jang, both of Hsin-Chu; Chao-Cheng Chen, Matou, all of Taiwan

[73] Assignee: Taiwan Semiconductor Manufacturing Company, Hsin-Chu, Taiwan

[21] Appl. No.: 09/044,763

[22] Filed: Mar. 20, 1998

[51] Int. Cl.[7] .............................. G03F 7/20; H01L 21/027
[52] U.S. Cl. ..................... 430/316; 430/313; 430/317; 216/41; 216/48; 216/67; 216/79; 216/80; 427/96; 427/145; 438/712; 438/723
[58] Field of Search ...................................... 430/313, 316, 430/317; 216/41, 48, 67, 79, 80; 427/96, 145; 438/712, 723

[56] References Cited

U.S. PATENT DOCUMENTS

| | | | |
|---|---|---|---|
| 4,654,112 | 3/1987 | Douglas et al. | 438/723 |
| 4,808,259 | 2/1989 | Jillie, Jr. et al. | 438/593 |
| 4,915,779 | 4/1990 | Srodes et al. | 438/717 |
| 5,468,342 | 11/1995 | Nulty et al. | 438/714 |

OTHER PUBLICATIONS

"Silicon Processing for the VLSI Era—vol. 1" Lattice Press, Sunset Beach, CA, 198, p463.

*Primary Examiner*—Mark F. Huff
*Attorney, Agent, or Firm*—George O. Saile; Stephen B. Ackerman

[57] ABSTRACT

A method for etching of sub-quarter micron openings in insulative layers for contacts and vias is described. The method uses high resolution DUV photolithography. By using a thin layer of photoresist to pattern a hardmask, full advantage of the high resolution can be attained. The hardmask in turn, is sufficiently durable to withstand subsequent etching of the insulative layer. The methods taught by this invention are of particular value for the formation of contacts to semiconductive devices although they are also applied to forming via openings. DUV photoresists having thicknesses of less than 500 nm are used with a DUV stepper. The hardmask materials include Ti/TiN and amorphous silicon. Etching selectivities of these materials with respect to typical insulative materials used in integrated circuit manufacture are of the order of 50:1.

24 Claims, 5 Drawing Sheets

VLSIC PATTERNING PROCESS

BACKGROUND OF THE INVENTION

(1) Field of the Invention

The invention relates to processes for the manufacture of semiconductor devices and more particularly to processes for forming opening for metal contacts and Vias.

(2) Description of Prior Art

The integrated circuit (IC) industry continues relentlessly towards smaller device geometries and greater circuit densities. This trend is made possible by the development of new manufacturing techniques as well as innovative improvements of existing procedures thereby extending their utility further towards miniaturization and higher density. The benefits and rewards of these efforts in very large scale integrated circuit(VLSIC) technology development are extraordinary. Not only are the ICs of today cheaper to produce, they continue to reward the end user with improved reliability and increased speed.

One such discipline wherein the limits of technology are constantly tested is the formation of openings in insulative layers wherein contacts to subjacent semiconductive elements are made. These openings generally represent the smallest photolithographically defined features of the integrated circuit. The openings are typically formed by reactive ion etching (RIE) through the insulative layer using a patterned photoresist mask. RIE is a well known anisotropic etching technique which can provide deep vertical openings having high aspect ratios. The aspect ratio in this regard is defined as the depth of the opening divided by its width.

The steady evolution in the capabilities of advanced optical lithography systems using 248 nm. wavelength laser light has made the achievement of 230 nm. resolution possible. In spite of the improvements in lens quality, however, these resolutions come at the expense of very small depth of focus. The resolution, $2b$, according to Rayleigh's criterion may be expressed by:

$$2b = K_1 \frac{\lambda}{NA}$$

where $2b$ is smallest distance between two resolved points. $\lambda$ is the wavelength of the light and NA is the numerical aperture of the lens (see Wolf, S. and Tauber, R. N., "Silicon Processing for the VLSI Era", Vol. 1, Lattice Press, Sunset Beach, Calif., (1986), p463). In order to achieve a resolution of 250 nm. using 248 nm. wavelength light source, a numerical aperture of about 0.65 is required. The constant $K_1$, is typically about 0.6 but can be further reduced by the use of techniques such as off-axis illumination, phase shifting masks (PSM), and optical proximity correction (OPC), thereby further improving the resolution.

The depth of focus a, may be expressed by:

$$\sigma = \frac{\lambda}{(NA)^2}$$

It can readily be seen that the depth of focus decreases rapidly at short wavelengths and high numerical apertures. In order to achieve the above resolution, a depth of focus of only 587 nm. must be contended with.

The formation of contact openings for sub-quarter micron IC technology requires such a fine photolithographic resolution. The narrow depth of focus dictates the use of photoresist layer having a thickness no greater than, and preferably smaller than the depth of focus. In the conventional process, the photoresist layer must be sufficiently thick to endure the etching period wherein the RIE of the insulative layer takes place. The insulative layer is typically between about 6,000 and 20,000 Angstroms thick. The photoresist materials used in deep-Ultraviolet (DUV) photolithography do not afford a sufficiently high etch rate selectivity to permit the use of thin enough photoresist layers. In order to etch the contact openings through the insulative layer, typically 8,000 to 20,000 Å of photoresist is required. This exceeds the amount permitted to achieve the required resolution.

The method of this invention utilizes a hard mask which is deposited over the insulative layer. This mask is then patterned using a thin photoresist layer. Then, using the residual photoresist and the hard mask, the insulative layer is etched. The hard mask affords a high etch rate selectivity for the RIE of the insulative layer and therefore can be made relatively thin. Consequently the thickness of the photoresist layer required to pattern the hard mask is also reduced, placing it well within the limits required to achieve optimum photolithographic resolution.

Hardmasks have been used in other etching applications. Douglas et.al., U.S. Pat. No. 4,654,112 uses an intermediate hardmask of plasma enhanced chemical vapor deposited (PECVD) silicon to etch an insulative layer using nitrogen trifluoride plus oxygen chemistry. The $NF_3/O_2$ combination had a high $SiO_2/Si$ selectivity and did not produce residues as did a conventional fluorocarbon with $O_2$ combination. The $NF_3/O_2$ chemistry is deleterious to organic materials such as photoresist so a photoresist mask could not be used for the oxide etching. Instead a hardmask was formed by patterning a layer of PECVD silicon over the oxide layer. The silicon hardmask was able to withstand the corrosiveness of the $NF_3/O_2$ atmosphere.

Likewise Srodes, et.al., U.S. Pat. No. 4,915,779 utilized a material such as silicon oxide to protect the surface of an aluminum alloy layer during the patterning of the aluminum with $CF_4$, $O_2$, $BCl_3$, and $Cl_2$. The photoresist layer used to pattern the hardmask was between 1.2 t o 2.5 microns thick.

Jillie, et.al., U.S. Pat. No. 4,808,259 performs an RIE through a stack wherein the photoresist pattern resides upon an upper layer, part of which may be expendable after the photoresist is depleted. However, this is not a true hardmask technique.

SUMMARY OF THE INVENTION

Accordingly, it is an object of this invention to provide a method for forming contact or via openings in sub-micron integrated circuits using thin photoresist thereby gaining full benefit of the 250 nm. or better resolution available with DUV photolithography.

It is another object of this invention to provide a method for forming high resolution contact and via patterns without using PSM.

It is another object of this invention to provide a method for forming a high etch rate selectivity RIE hardmask for etching patterns in insulative layers.

It is yet another object of this invention to provide a method for using thin layers of photoresist to form RIE hardmasks.

It is yet another object of this invention to provide a means for distributing plasma charge during RIE of contact and via openings of MOSFETs wherein conductive paths to sensitive device elements are exposed to a plasma, thereby reducing plasma damage to gate oxides and source/drain regions.

These objects are achieved by using a thin layer of photoresist to pattern a hardmask. Thereby full advantage of the high resolution can be attained. At the same time the hardmask provides a high selectivity for etching the insulative layer. The methods taught by this invention are of particular value for the formation of contacts to semiconductive devices although they are also applied to forming via openings. DUV photoresists having thicknesses of less than 500 nm are used with a DUV stepper. The hardmask materials include Ti/TiN and amorphous silicon. RIE selectivities of these materials for typical insulative layer used in integrated circuit manufacture are of the order of 50:1.

DESCRIPTION OF THE PREFERRED EMBODIMENTS

Figure 1:
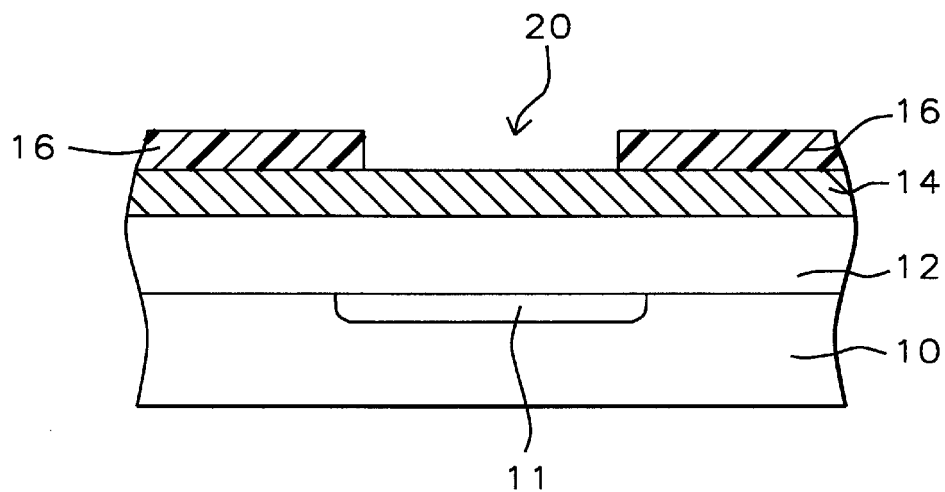
FIG. 1 through FIG. 7 are a cross sections illustrating the processing steps of a first embodiment of this invention.

In a first embodiment of this invention a contact opening is etched using a layer of amorphous silicon ($\alpha$ silicon) as a hardmask. Referring to FIG. 1 a p-type, monocrystalline silicon wafer 10 is provided. Semiconductor devices, for example, MOSFETs and bipolar transistors, are formed within the surface of wafer 10. A region 11 is an element of such a device, for example a source/drain of a MOSFET, to which an electrical contact is to be formed. The devices, which may also have elements(not shown) formed over the silicon wafer surface, for example insulated gate structures, are typically isolated by regions of field oxide(not shown). The devices are formed according to procedures well known and widely practiced by those in the art.

An interlevel dielectric layer (ILD) 12 comprising silicon oxide, phosphosilicate glass (PSG), borophosphosilicate glass (BPSG) or combinations thereof is formed over the wafer 10 to a thickness of between about 2,000 to 5,000 Angstroms. The deposition is performed preferably by low pressure chemical vapor deposition(LPCVD) or plasma enhanced chemical vapor deposition(PECVD).

A layer of $\alpha$ silicon 14 is next deposited over the ILD layer 12 by LPCVD or PECVD using conventional precursors and parameters well known in the art. The layer could also be deposited by sputtering. The layer 14 is deposited to a thickness between about 100 and 1,000 Angstroms. Optionally a bottom anti reflective coating (BARC) layer may be deposited over the $\alpha$ silicon layer 14.

A thin photoresist layer 16 between about 1,000 and 8,000 Angstroms thick is deposited over the $\alpha$ silicon layer 14. The photoresist 16 is patterned to define a contact opening 20 using conventional photolithographic procedures, preferably high resolution DUV photolithography.

Figure 2:
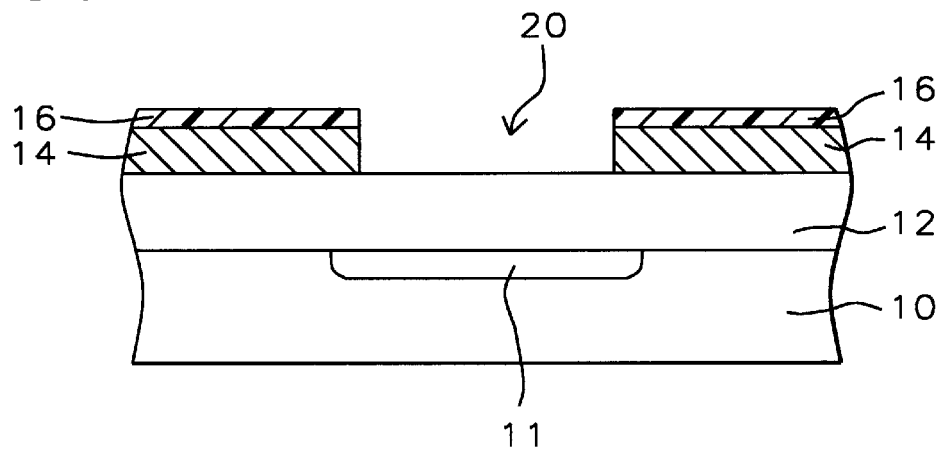

Referring now to FIG. 2 the substrate wafer 10 is place in a RIE tool and the $\alpha$ silicon layer 14 is etched using well known silicon etchant gas mixtures, for example mixtures containing HBr, $BCl_3$, and/or $Cl_2$ Endpoint is detected, preferably by optical emission spectroscopy, and detecting by the appearance of an $O_2$ signal. Alternatively a timed etch period may be employed. The RIE parameters are configured by methods of process optimization so that approximately 500 Angstroms of photoresist layer 16 remain after the opening 20 in the $\alpha$ silicon layer 14 has been etched.

Figure 3:
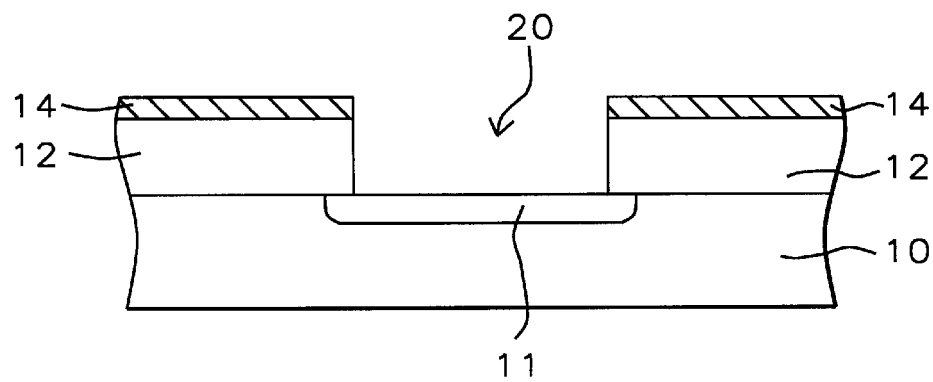

Referring now to FIG. 3, the contact opening 20 is completed by etching the ILD layer 12 using the remaining photoresist 16 and the $\alpha$ silicon hardmask 14. The etching is accomplished using a mixture of fluorocarbons containing, for example, $CF_4$, $C_2F_6$, $C_4F_8$, $CHF_3$, and $O_2$. The respective flow rates and etching parameters are experimentally optimized by etchant and parameter selection to obtain high etch rate selectivities for the ILD layer material with respect to the $\alpha$ silicon hardmask. These optimization procedures are well known to those skilled in the art.

The etch rate selectivity of the $\alpha$ silicon hardmask to various insulative materials used for ILD layers is given in Table I. This high selectivity permits the use of a thin hardmask to etch the ILD layer which in turn allows the use of a thin photoresist layer.

TABLE I

Approximate selectivities of various masks
(ILD etch rate:Mask etch rate)

| Mask | ILD Material | | |
|---|---|---|---|
|  | $SiO_2$ | BPSG | PSG |
| Photoresist | 2–3:1 | 3:1 | 3:1 |
| TiN/Ti | $\geq$50:1 | — | — |
| $\alpha$ Silicon | $\geq$50:1 | 100:1 | 100:1 |

Figure 4:
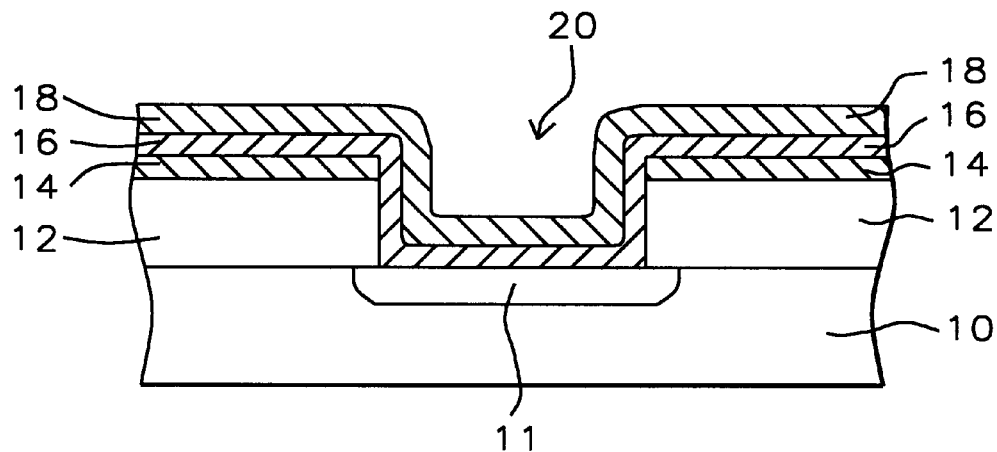

A polymer, which is formed during via RIE, is next removed by using a liquid stripper or by plasma ashing. These procedures are well know by those in the art. A Ti/TiN glue/barrier metallurgy is next deposited, typically by sputtering. Referring to FIG. 4 a glue layer of titanium 16, between about 100 and 800 Angstroms thick, is deposited over the remaining $\alpha$ silicon 14 and into the opening 20. This is immediately followed by a barrier layer of TiN 18 deposited in the same tool without breaking vacuum. The TiN layer 18 is between about 300 and 500 Angstroms thick.

Figure 5:
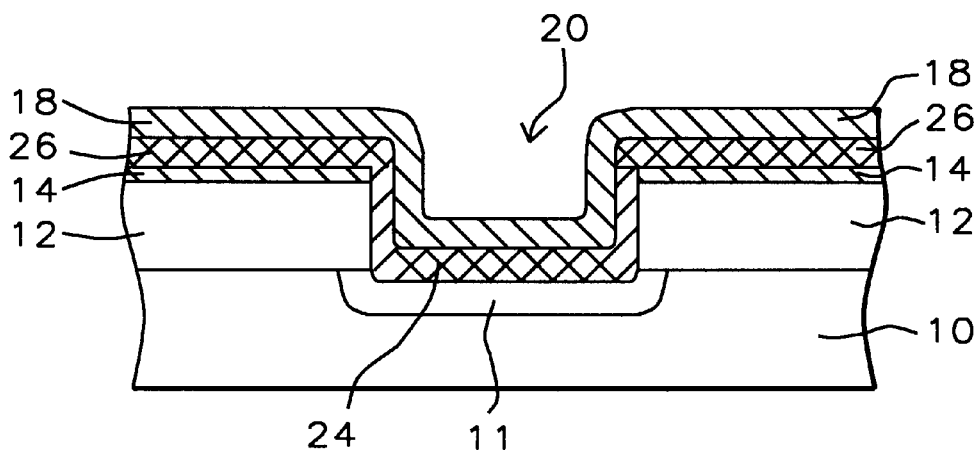

Referring to FIG. 5, the wafer 10 is then subjected to a rapid thermal annealing procedure in nitrogen wherein the Ti layer at the base of the opening 20 reacts with the substrate silicon to form a titanium suicide bonding layer 24. At the same time the remaining $\alpha$ silicon layer 14 also reacts with the Ti, thereby converting some if not all of the remaining $\alpha$ silicon into titanium silicide 26.

Figure 6:
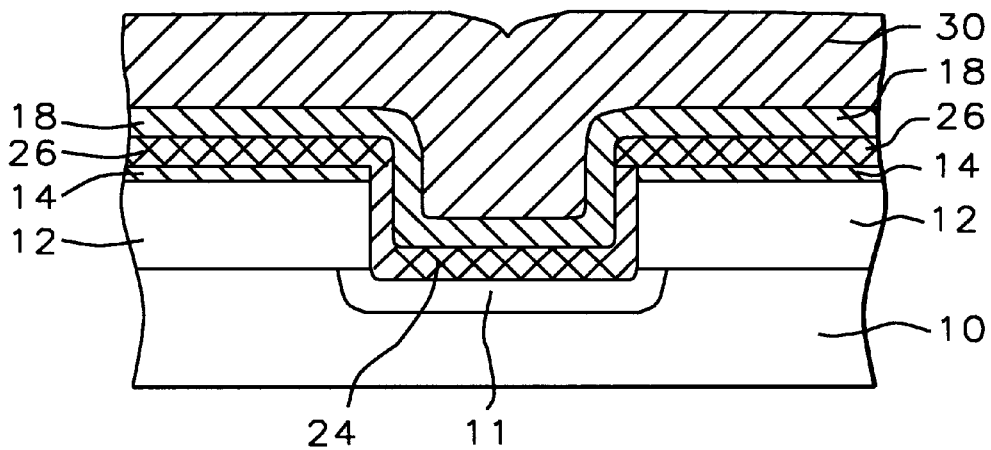
Figure 7:
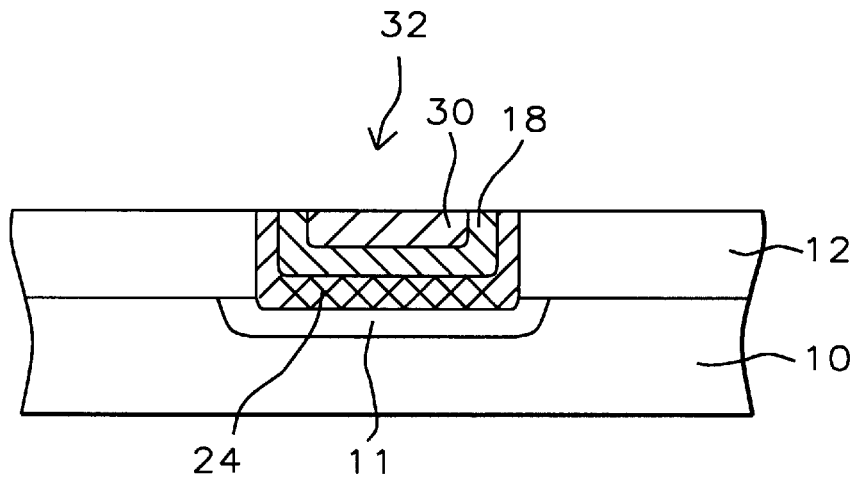

A tungsten plug contact is next formed in the opening 20 by conventional methods well known to those skilled in the art. Referring to FIG. 6, a layer of LPCVD tungsten 30 is next deposited over the wafer to fill the contact opening 20. The tungsten layer 30, the TiN 18, the $TiSi_2$ 26 and any remaining $\alpha$ silicon 14 over the ILD layer 12 are then etched back by RIE to complete the formation of a tungsten plug contact 32 as shown in FIG. 7.

In a second embodiment of this invention a via opening is formed in a dielectric layer exposing a subjacent conductive element of an integrated circuit interconnection level. The interconnection level used in the present embodiment is an aluminum wiring pattern although vias openings to other patterned conductive materials, for example polysilicon, may also form by the method of this embodiment. A Ti/TiN hardmask is used to form the via. The TiN also serves as an anti reflective coating (ARC) during photoresist exposure. After the opening is etched, the residual hardmask remains in place during a subsequent tungsten deposition.

Figure 8:
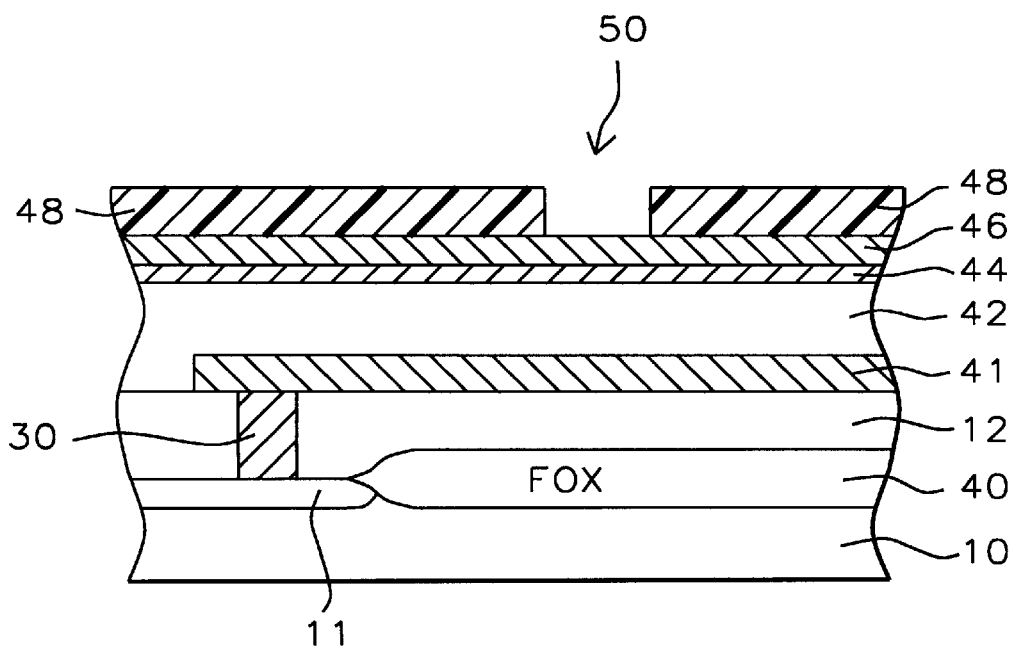
FIG. 8 through FIG. 12 are a cross sections illustrating the processing steps of a second embodiment of this invention

Referring to FIG. 8, an p-type, monocrystalline silicon wafer 10 is provided. Semiconductor devices, for example, MOSFETs and bipolar transistors(not shown), are formed within the surface of wafer 10. FIG. 8 shows a active region 11 of a semiconductor device which is isolated by as region of field oxide 40. The procedures for the formation of semiconductor devices and the regions of field oxide are well known by those skilled in the art. An insulative layer 12, preferably comprising silicon oxide, phosphosilicate glass (PSG), borophosphosilicate glass (BPSG) or combinations thereof is formed by LPCVD or PECVD over the devices. A tungsten plug contact 30 is formed to the active element 11 preferably by the method described in the first embodiment of this invention.

An aluminum metallization layer 41 is deposited on the insulative layer 11 using methods well known to those skilled in the art, for example, by sputtering or vacuum evaporation. The layer 41 is then patterned using well known photolithographic procedures commensurate with the technology. The interconnective metallization layer 41, as used in this embodiment is a first interconnective layer and is electrically connected to semiconductive device element 11 through the contact 30.

An inter metal dielectric (IMD) layer 42, preferably comprising silicon oxide, phosphosilicate glass (PSG), borophosphosilicate glass (BPSG) or combinations thereof is formed by LPCVD or PECVD is over the patterned aluminum metallization layer 41. The layer 42 is between about 5,000 and 15,000 Angstroms thick.

A titanium layer 44 is next deposited over the IMD layer 42 to a thickness of between about 100 and 1,000 Angstroms, preferably by sputtering. A TiN layer 46 between about 200 and 1,500 Angstroms thick is then deposited over the titanium layer 44 in the same tool without breaking vacuum.

A photoresist layer 48 between about 1,000 and 8,000 Angstroms thick is deposited over the TiN layer 46. The photoresist 48 is patterned to define a via opening 50 using photolithographic procedures, preferably high resolution DUV photolithography. The TiN layer 46 serves not only as a hardmask for the subsequent RIE of the IMD layer 42 but also as an ARC during the photoresist exposure.

Figure 9:
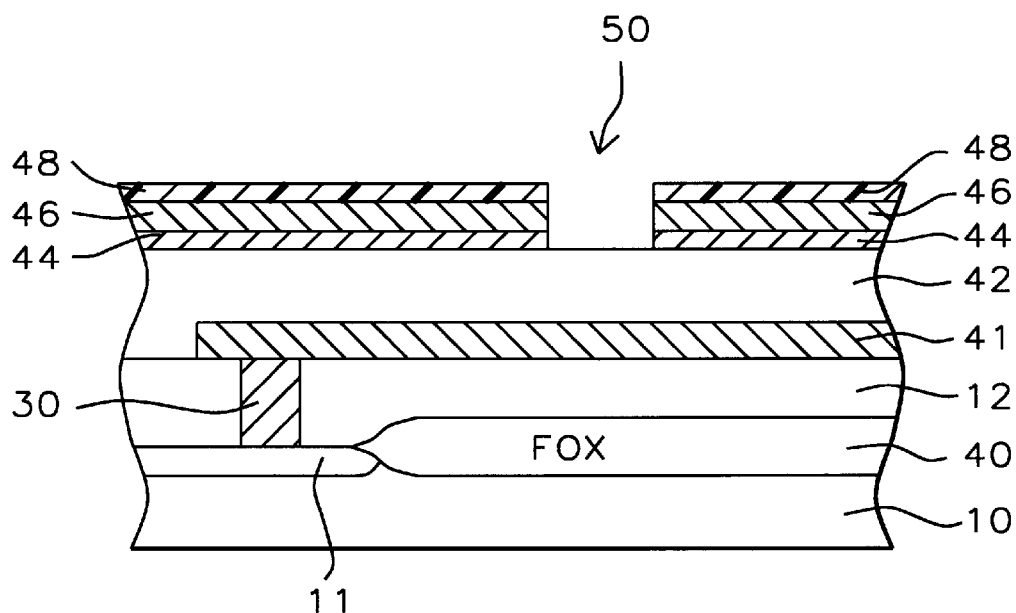

Referring now to FIG. 9 the substrate wafer 10 is placed in a RIE tool and the Ti/TiN layer 44,46 is etched using well known etchant gas mixtures for these layers, for example mixtures containing $BCl_3$ and $Cl_2$. The respective flow rates and etching parameters are experimentally optimized by etchant and parameter selection to obtain high etch rate selectivities for the Ti/TiN layer with respect to photoresist. These optimization procedures are well known to those skilled in the art. Endpoint is preferably determined by the appearance of an $O_2$ signal using optical emission spectroscopy. Alternatively a timed etch period may be employed. The RIE parameters are configured by well known procedures of process optimization so that approximately 500 Angstroms of photoresist layer 48 remains after the opening 50 in the Ti/TiN layer 44,46 has been etched.

Figure 10:
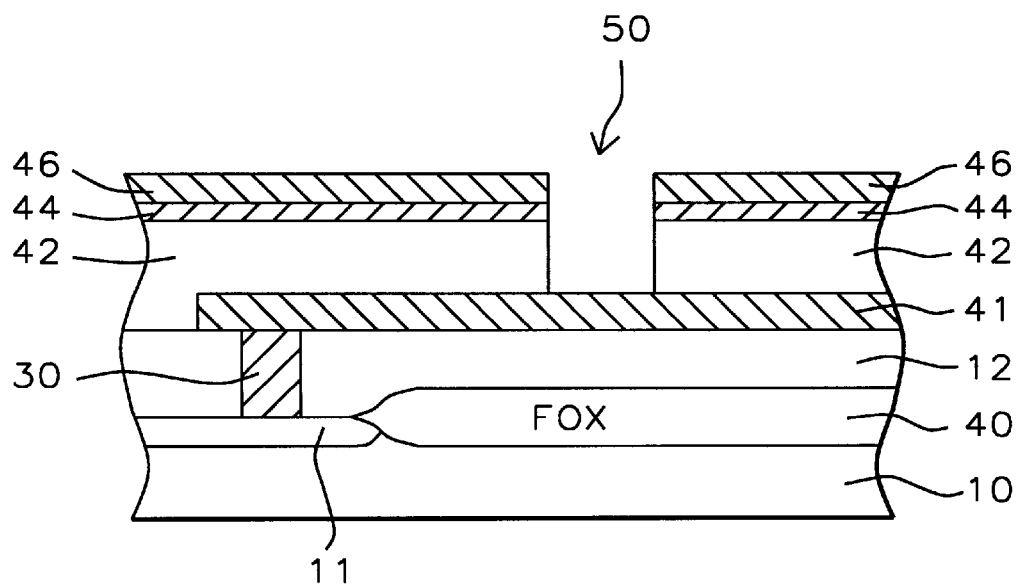

Referring now to FIG. 10, the via opening 50 is completed by etching the IMD layer 42 using the remaining photoresist 46 and the Ti/TiN hardmask 44,46. The etching is accomplished using a mixture containing fluorocarbons, for example, $CF_4$, $C_2F_6$, $C_4F_8$, $CHF_3$, and $O_2$. The respective flow rates and etching parameters are experimentally optimized by etchant and parameter selection to obtain high etch rate selectivities for the ILD layer material with respect to the TiN/Ti hardmask. These optimization procedures are well known to those skilled in the art.

The high selectivity of the TiN/Ti hardmask may be attributed primarily to the durability of the Ti layer to the ILD etchant gases. The TiN layer serves primarily to protect the Ti layer from oxidation during exposure to atmosphere prior to the RIE procedure.

A polymer, which is formed during via RIE, is next removed by using a liquid stripper or plasma ashing. These procedures are well know by those in the art.

Figure 11:
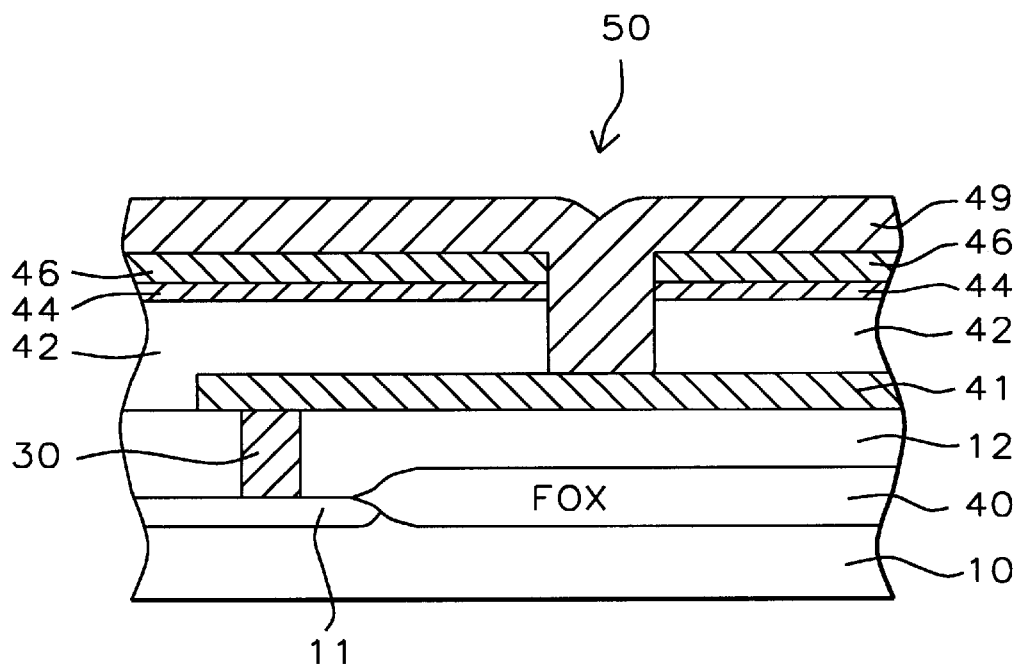
Figure 12:
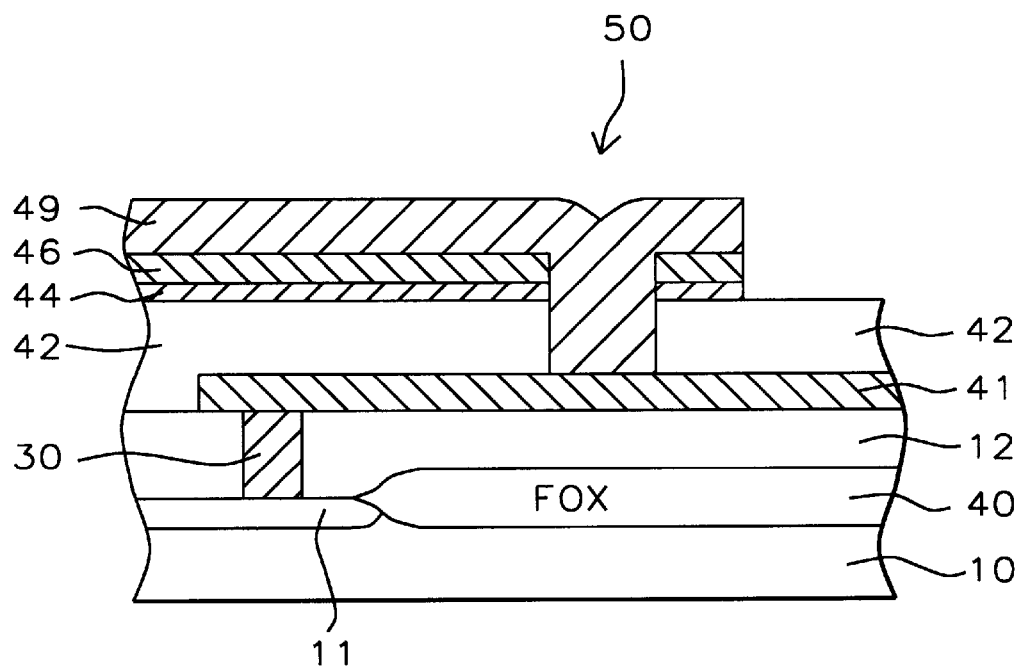

Referring next to FIG. 11, an aluminum layer 49 is next deposited over the wafer by methods well known to those skilled in the art, for example, by sputtering or vacuum evaporation. The layer 49 and residual Ti/TiN layer 44,46 over the IMD layer 42 are then etched back by RIE to complete the formation of a second level of interconnection metallurgy as shown in FIG. 12.

The via formed in the second embodiment interconnects a first metallization level with a second. Integrated circuits can have additional metallization levels. It should be understood that The method of the second embodiment can be equally applied to vias between any two metallization levels.

The preferred embodiments of this invention teach the formation of sub-quarter micron contacts using high resolution DUV photolithography. By using a thin layer of photoresist, full advantage of the high resolution photolithography can be realized to pattern a hardmask. At the same time the hardmask provides a high selectivity for etching the insulative layer. These benefits of the invention are of particular value in the formation of vias and contacts. It has been found that the use of a conductive hardmask for forming contacts provides the additional benefit of distributing plasma charge during RIE, thereby reducing plasma damage to gate oxides and source/drain regions of MOSFETs.

While the invention has been particularly shown and described with reference to the preferred embodiments thereof, it will be understood by those skilled in the art that various changes in form and details may be made without departing from the spirit and scope of the invention.

Whereas the embodiments of this invention utilize a p-type silicon substrate, an n-type silicon substrate could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated.

What is claimed is:

1. A method for forming an opening in an insulative layer on a semiconductor wafer using DUV photolithograghy comprising:

(a) providing a substrate having an insulative layer in which said opening is to be formed;

(b) depositing a layer of hardmask material over said insulative layer;

(c) depositing a between about 0.1 and 0.8 micron thick photoresist layer whereby the thickness of said photoresist layer is less than or about equal to the depth of focus of said DUV photolithography;

(d) patterning said photoresist by means of a DUV stepper, thereby defining an opening;

(e) etching said hardmask material, thereby forming a hardmask; and (f) etching said insulative layer with an etchant containing fluorocarbons and $O_2$, thereby forming said opening.

2. The method of claim 1 wherein said insulative layer is taken from the group consisting of silicon oxide, a borosilicate glass and a borophosphosilicate glass.

3. The method of claim 1 wherein said insulative layer is between about 5,000 and 15,000 Angstroms thick.

4. The method of claim 1 wherein said DUV stepper exposes said photoresist with radiation having a wavelength of less than 250 nm.

5. The method of claim 1 wherein said hardmask comprises a Ti layer having a thickness between about 100 and 800 Angstroms and a TiN layer formed over said Ti layer having a thickness of between about 200 and 1,000 Angstroms.

6. The method of claim 1 wherein said hardmask comprises an amorphous Si layer having a thickness between about 100 and 1,000 Angstroms.

7. The method of claim 1 wherein said hardmask material is etched by reactive ion etching using an etchant containing HBr, $BCl_3$, and $Cl_2$.

8. The method of claim 1 wherein said insulative layer is etched by reactive ion etching.

9. A method for forming a contact to a semiconductive device on a silicon wafer using DUV photolithography comprising:

(a) providing a silicon wafer having an integrated circuit device formed in its surface and an insulative layer formed over said integrated circuit device;

(b) depositing a layer of hardmask material over said insulative layer;

(c) depositing a between about 0.1 and 0.8 micron thick photoresist layer whereby the thickness of said photoresist layer is less than or about equal to the depth of focus of said DUV photolithography;

(d) patterning said photoresist by means of a DUV stepper, thereby defining an opening for said contact;

(e) etching said hardmask material, thereby forming a hardmask;

(f) etching said insulative layer with an etchant containing fluorocarbons and $O_2$, thereby forming said opening;

(g) stripping a polymer layer which forms over said hardmask during etching;

(h) depositing a metal layer over said silicon wafer; and (i) etching said metal layer and said hardmask, thereby forming a contact plug in said opening.

10. The method of claim 9 wherein said insulative layer is taken from the group consisting of silicon oxide, a borosilicate glass and a borophosphosilicate glass.

11. The method of claim 9 wherein said insulative layer is between about 2,000 and 5,000 nm thick.

12. The method of claim 9 wherein said DUV stepper exposes said photoresist with radiation having a wavelength of less than 250 nm.

13. The method of claim 12 wherein said hardmask comprises amorphous Si having a thickness between about 100 and 1,000 Angstroms.

14. The method of claim 13 wherein said hardmask material is etched by reactive ion etching using an etchant containing HBr, $BCl_3$, and $Cl_2$.

15. The method of claim 9 wherein said insulative layer is etched by reactive ion etching.

16. The method of claim 13 further comprising depositing a Ti/TiN glue/barrier layer after step (g) and before step (h).

17. The method of claim 16 wherein said Ti/TiN glue/barrier layer is subjected to a rapid thermal anneal whereby remaining silicon hardmask is converted to titanium silicide.

18. A method for forming a via opening in an insulative layer on a silicon wafer using DUV photolithography comprising:

(a) providing a silicon wafer having integrated circuit devices formed in its surface, an interconnection metallization layer, and an insulative layer formed on said metallization layer;

(b) depositing a layer of hardmask material over said insulative layer;

(c) depositing a between about 0.1 and 0.8 micron thick photoresist layer whereby the thickness of said photoresist layer is less than or about equal to the depth of focus of said DUV photolithography;

(d) patterning said photoresist by means of a DUV stepper, thereby defining a via opening over a portion of said metallization layer;

(e) etching said hardmask material, thereby forming a hardmask;

(f) etching said insulative layer with an etchant containing fluorocarbons and $O_2$, thereby forming said via opening and exposing said metallization layer; and (g) stripping a polymer layer which forms over said hardmask during etching.

19. The method of claim 18 wherein said insulative layer is taken from the group consisting of silicon oxide, a borosilicate glass and a borophosphosilicate glass.

20. The method of claim 18 wherein said insulative layer is between about 5,000 and 15,000 Angstroms thick.

21. The method of claim 18 wherein said DUV stepper exposes said photoresist with radiation having a wavelength of less than 250 nm.

22. The method of claim 18 wherein said hardmask comprises a Ti layer having a thickness between about 100 and 1,000 Angstroms and a TiN layer having a thickness of between about 200 and 1,500 Angstroms formed on said Ti layer.

23. The method of claim 22 wherein said hardmask material is etched by reactive ion etching using an etchant containing HBr, $BCl_3$, and $Cl_2$.

24. The method of claim 18 wherein said insulative layer is etched by reactive ion etching.

* * * * *